United States Patent
Zhong et al.

(10) Patent No.: US 10,299,394 B2
(45) Date of Patent: May 21, 2019

(54) ELECTRICAL FUNCTION CASSETTE HAVING WATERPROOF FUNCTION AND VENTILATING FAN EMPLOYING THE SAME

(71) Applicant: Panasonic Ecology Systems Guangdong Co., Ltd., Guangdong (CN)

(72) Inventors: Shenghui Zhong, Guangdong (CN); Qiuqian Liang, Guangdong (CN)

(73) Assignee: PANASONIC ECOLOGY SYSTEMS GUANGDONG CO., LTD. (CN)

( * ) Notice: Subject to any disclaimer, the term of this patent is extended or adjusted under 35 U.S.C. 154(b) by 0 days.

(21) Appl. No.: 15/685,243

(22) Filed: Aug. 24, 2017

(65) Prior Publication Data

US 2018/0063973 A1    Mar. 1, 2018

(30) Foreign Application Priority Data

Aug. 26, 2016  (CN) .................... 2016 2 0947932 U

(51) Int. Cl.
| | |
|---|---|
| *H05K 5/02* | (2006.01) |
| *H05K 5/06* | (2006.01) |
| *H05K 5/03* | (2006.01) |
| *F04D 25/06* | (2006.01) |
| *F04D 29/42* | (2006.01) |

(52) U.S. Cl.
CPC ......... *H05K 5/0213* (2013.01); *F04D 25/068* (2013.01); *F04D 29/4226* (2013.01); *H05K 5/0239* (2013.01); *H05K 5/0247* (2013.01); *H05K 5/03* (2013.01); *H05K 5/069* (2013.01)

(58) Field of Classification Search
CPC ............................ H05K 5/0247; H05K 5/069
See application file for complete search history.

(56) References Cited

U.S. PATENT DOCUMENTS

| | | | | | |
|---|---|---|---|---|---|
| 5,967,829 | A  * | 10/1999 | Shinchi | ................ | H01R 13/504 29/871 |
| 6,273,181 | B1 * | 8/2001 | Matsui | ................ | B60R 16/0239 165/185 |
| 9,620,265 | B2 * | 4/2017 | Peterson | ................ | H01B 17/30 |
| 2001/0002622 | A1 * | 6/2001 | Teunisse | ................ | H01R 4/646 174/360 |
| 2002/0057360 | A1 * | 5/2002 | Abe | ..................... | H04N 5/2252 348/373 |
| 2008/0149385 | A1 * | 6/2008 | Kanamaru | ............. | H02G 3/083 174/520 |
| 2015/0138785 | A1 * | 5/2015 | Oksengendler | ....... | F21V 15/012 362/374 |

* cited by examiner

*Primary Examiner* — Hung V Ngo
(74) *Attorney, Agent, or Firm* — RatnerPrestia

(57) ABSTRACT

The present disclosure provides an electrical function cassette having a waterproof function. The electrical function cassette includes: a function box for housing an electrical component, and a waterproof portion in a hollow rectangular parallelepiped shape, wherein a first surface of the waterproof portion is provided with a wiring opening corresponding to a wiring port, and a second surface of the waterproof portion adjacent to the first surface is provided with an insertion opening for inserting a lead wire into the electrical function cassette, such that water droplets cannot flow along the lead wire in a straight line into the electrical function cassette, thereby improving the safety and reliability of the whole product.

22 Claims, 10 Drawing Sheets

ELECTRICAL FUNCTION CASSETTE HAVING WATERPROOF FUNCTION AND VENTILATING FAN EMPLOYING THE SAME

CROSS REFERENCE TO RELATED APPLICATIONS

This application claims priority to Chinese Patent Application No. 201620947932.1, filed Aug. 26, 2016, the contents of such application being incorporated by reference herein.

BACKGROUND OF THE INVENTION

Field of the Invention

The present disclosure relates to the field of electrical and electronic technology, and more particularly to an electrical function cassette having a waterproof function and a ventilating fan employing the same.

Description of the Related Art

A Ventilating fan, also known as an exhaust fan or a venting fan, is a kind of air conditioning electric appliance, in which, its fan blade is driven by a motor to rotate so as to drive the air flow and implement the indoor and outdoor air exchange. The ventilating fan is widely used in factories, warehouses, public places, families and other occasions.

Please referring to FIGS. 1 and 2, the ventilating fan 1 includes a main housing 5, a casing 2 provided in the main housing 5, an air blower 3 provided in the casing 2, and a circuit board box 4 fixed on the casing 2 and composed of a box body 410 and a box cover 420. The circuit board box 4 is provided with an opening 430 through which a lead wire (not shown) passes.

It is to be noted that for the ventilating fan 1 shown in FIG. 1, the lead wire enters into the circuit board box 4 through the opening 430. When water vapor enters the ventilating fan 1, the water vapor adheres to the lead wire to form water droplets, which flow along the lead wire into the opening 430 of the circuit board box 4 and eventually enter the circuit board box 4 to cause damage to the control circuit board (not shown) in the box, thereby affecting the safety and reliability of the entire ventilating fan 1.

SUMMARY OF THE INVENTION

(I) The Technical Problems to be Solved

In view of the above technical problems, the present disclosure provides an electrical function cassette having waterproof function and a ventilating fan employing the same.

(II) Technical Solution

According to an aspect of the present disclosure, there is provided an electrical function cassette having waterproof function. The electrical function cassette comprises: a function box for housing an electrical component, and further comprises a waterproof portion in hollow rectangular parallelepiped shape, wherein a first surface of the waterproof portion is provided with a wiring opening corresponding to a wiring port, and a second surface of the waterproof portion adjacent to the first surface is provided with an insertion opening for inserting a lead wire into the electrical function cassette.

Preferably, in the electrical function cassette according to present disclosure, a surface defined by longest sides of the waterproof portion is provided to be parallel to a wall surface of the electrical function cassette provided with the wiring port, the insertion opening is provided on the second surface at a position farthest from the wiring opening.

According to another aspect of the present disclosure, there is provided another kind of electrical function cassette having waterproof function. The electrical function cassette comprises a function box for housing an electrical component, and further comprises a waterproof portion in hollow rectangular parallelepiped shape, wherein a first surface of the waterproof portion is provided with a wiring opening corresponding to a wiring port, and a third surface of the waterproof portion opposite to the first surface is provided with an insertion opening for inserting a lead wire into the electrical function cassette, and wherein a central axis of the wiring opening is offset from a central axis of the insertion opening.

Preferably, in the electrical function cassette according to present disclosure, a surface defined by longest sides of the waterproof portion is provided to be parallel to a wall surface of the electrical function cassette provided with the wiring port, and the insertion opening is provided on the third surface at a position farthest from the wiring opening.

Preferably, in the electrical function cassette according to present disclosure, a space connecting the insertion opening with the wiring opening is a guide passage.

Preferably, in the electrical function cassette according to present disclosure, the guide passage is provided with a rib capable of coming into contact with the lead wire therein.

Preferably, in the electrical function cassette according to present disclosure, an inner wall of the waterproof portion, i.e. a wall surface opposite to the wiring opening, is provided with a plurality of ribs protruding towards the lead wire from the wall surface; and the rib provided near the insertion opening in the guide channel has a larger protrusion height than the rib provided near the wiring opening in the guide channel.

Preferably, in the electrical function cassette according to present disclosure, an inner wall of the waterproof portion, i.e. a wall surface on which the wiring opening is located, is provided with a plurality of ribs protruding towards the lead wire from the wall surface; and the rib provided near the insertion opening in the guide channel has a smaller protrusion height than the rib provided near the wiring opening in the guide channel.

Preferably, in the electrical function cassette according to present disclosure, a surface adjacent to a wall surface on which the insertion opening is provided, is inclined in a direction such that the area of the vertical cross section of the guide passage becomes larger from the wiring opening to the insertion opening.

Preferably, in the electrical function cassette according to present disclosure, the electrical function cassette is provided with an engagement port for engaging a snap of a bundled lead wire.

Preferably, in the electrical function cassette according to present disclosure, the function box comprises: a box body and cover, wherein, a first part of the waterproof portion is provided on the box body, a second part of the waterproof portion is provided on the cover, and the first part and the second part are snap-fitted together so as to form the waterproof portion; and the first part is formed integrally with the box body, and the second part is formed integrally with the cover.

Preferably, in the electrical function cassette according to present disclosure, the electrical function cassette is a circuit board box or a power supply box.

According to a still further aspect of the present disclosure, there is provided a ventilating fan. The ventilating fan comprises: a main housing; an air blowing unit provided in the main housing and for sucking air into the main housing and blowing air out of the main housing; a control circuit board connected to the air blowing unit so as to control the operation of the air blowing unit; and a circuit board box, the circuit board box being the electrical function cassette mentioned above, the control circuit board being fixed in the circuit board box.

(III) Beneficial Effects

It can be seen from the above technical scheme that the electrical function cassette having the waterproof function and the ventilating fan employing the same have at least one of the following beneficial effects:

(1) the guide passage is designed such that the lead wire in the guide passage is bent at least once, and when the water droplets pass through the bending portion of the lead wire, the flow thereof will be stopped and will not continue to move toward the electrical function cassette;

(2) As an embodiment, the first surface and the second surface are not in the same plane but at an angle so as to form a guide passage, and the lead wire will be bent as it enters into the electrical function cassette through the guide passage. Such implementation is simplest and most cost-effective;

(3) As an embodiment, a first surface of the waterproof portion is provided with a wiring opening, and a third surface of the waterproof portion opposite to the first surface is provided with an insertion opening, and a central axis of the wiring opening is offset from a central axis of the insertion opening so as to form a guide passage, such that the lead wire will be bent as it enters into the electrical function cassette through the guide passage. Such implementation is also cost-effective;

(4) the inner wall of the waterproof portion is provided with the ribs, even if there is a small part of the water droplets entering into the guide passage, it will be blocked by the ribs on the guide passage, and would not enter into the circuit board box;

(5) On the basis of the above-mentioned (4), the height of the ribs at different positions is designed properly such that the rib near the insertion opening and the rib near the wiring opening have different protrusion heights from the wall toward the lead wire side, so that the lead wire will be inclined downwardly from the wiring opening to the insertion opening, and although the wiring opening is directed upwardly, it is difficult for the water droplets to enter into the circuit board box due to the inclination of the lead wire;

(6) the surface, adjacent to a wall surface on which the insertion opening is provided, is inclined in a direction such that the area of the vertical cross section of the guide passage becomes larger from the wiring opening to the insertion opening. When water droplets enter the guide passage along the lead wire, the water droplets drip at a position where the lead wire comes into contact with the wall surface and then flows out of the insertion opening in the oblique direction of the wall surface, due to the inclination of the wall surface toward the insertion opening.

Through the above design, prevention of water droplets from entering into the electrical function cassette is maximized, thereby improving the safety and reliability of the whole product.

THE LIST OF REFERENCE NUMERALS

Figure 1:
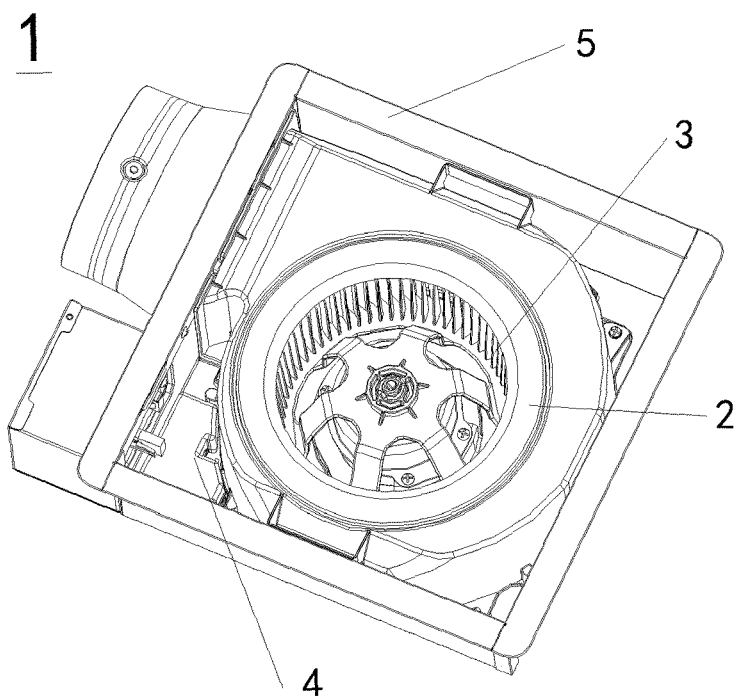
FIG. 1 is a structure schematic view of a traditional ventilating fan.
Figure 2:
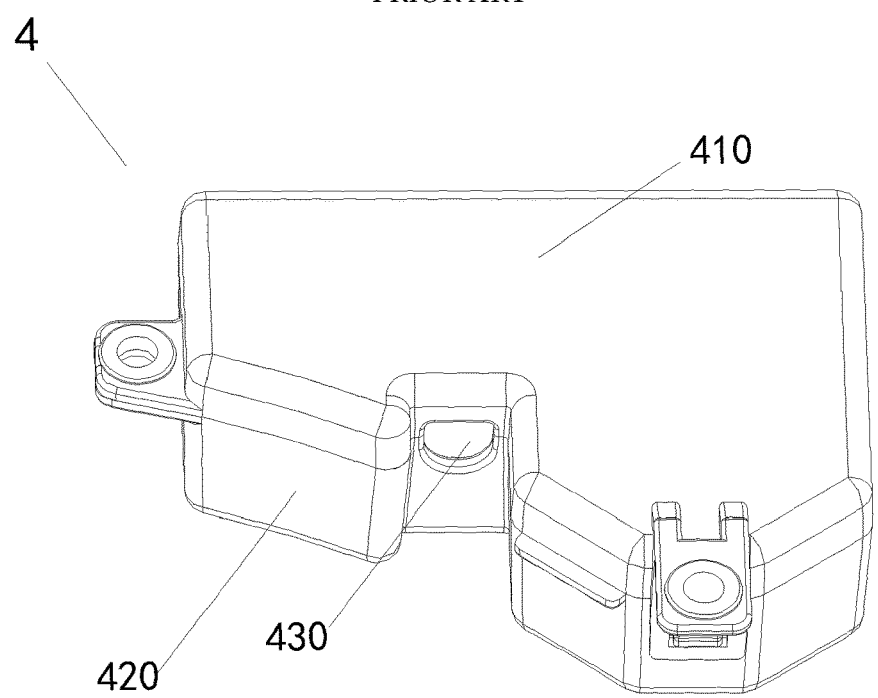
FIG. 2 is a perspective view of a circuit board box of the ventilating fan shown in FIG. 1.

10—main housing;
11—adapter;
12—air blowing unit;
13—suction opening;
20—casing;
30—air blower;
31—motor;
32—fan blade;
33—air inlet;
40—circuit board box;
41—box body;
42—cover;
43a—first wiring port;
43b—second wiring port;
44—engagement port;
45—control circuit board;
50—waterproof portion;
51—first wall surface;
51a—wiring opening in the first wall surface;
51a'—central axis of the wiring opening in the first wall surface;
52—second wall surface;
52a—insertion opening in the second wall surface;
53—third wall surface;
53a—insertion opening in the third wall surface;
53a'—central axis of the insertion opening in the third wall surface;
54—fourth wall surface;
55a—first waterproof portion, 55b—second waterproof portion,
A, B, C, D—ribs;
56—guide passage;
60—power supply box;
71—first lead wire;
72—second lead wire;
100—ventilating fan.

DETAILED DESCRIPTION OF PREFERRED
EMBODIMENTS OF THE INVENTION

The present disclosure provides an electrical function cassette having waterproof function. The electrical function cassette comprises: a function box for housing an electrical component, and further comprises a waterproof portion in hollow rectangular parallelepiped shape, wherein a first surface of the waterproof portion is provided with a wiring opening corresponding to a wiring port, and a second surface of the waterproof portion adjacent to the first surface is provided with an insertion opening for inserting a lead wire into the electrical function cassette, such that the water droplets cannot flow straight along the lead wire into the electrical function cassette, thereby avoiding damage to the electrical component in the electric cassette. Typically, the electrical function cassette may be a circuit board box, a power supply box, or the like. Based on the above, the present disclosure further provides a ventilating fan having the circuit board box.

In order to make the purpose, technical solutions and advantages of the present disclosure more obvious, the present disclosure will be described in more detail with reference to the accompanying drawings. Through the following description of the embodiments, those skilled in the art should have a clear understanding of the electrical function cassette and the ventilating fan employing the same of the present disclosure.

The First Embodiment

In the first embodiment of the present disclosure, a ventilating fan 100 is provided. Please referring to FIG. 3, the ventilating fan 100 of the present embodiment includes: a main housing 10 for forming an external contour; an air blowing unit 12 provided in the main housing 10 and for sucking air into the main housing 10 and blowing air out of the main housing 10; a control circuit board 45 connected to the air blowing unit 12 so as to control the operation of the air blowing unit 12; and a circuit board box 40 for housing the control circuit board 45.

A waterproof portion 50 is provided outside the circuit board box 40. The guide passage 56 is formed inside the waterproof portion 50 such that the first lead wire 71 connecting the air blower 30 and the control circuit board 45 is bent at least once when it is inserted into the circuit board box 40 through the guide passage 56.

The various components of the ventilating fan 100 according to the present disclosure will be described in detail below.

The main housing 10 is in a hollow rectangular parallelepiped shape and has a suction opening 13 for allowing air to enter the main housing 10 and an exhaust opening (not shown) for discharging the air out of the main housing 10. The suction opening 13 is provided in a largest wall surface included in the six surfaces forming the main housing 10, that is, the suction opening 13 is provided in a top surface in the drawing. The exhaust opening is provided in the wall surface adjacent to the bottom surface, that is, the exhaust opening is provided in a side wall surface. An adapter 11 is provided on the air downstream side of the exhaust opening and is connected to a ventilation duct.

It should be noted that although the main housing 10 is designed in a hollow rectangular parallelepiped shape in the present embodiment, the present disclosure is not limited thereto. In the present disclosure, the main housing 10 may also be designed in a circular or polygonal shape as long as a housing space, in which the air blowing unit 12, the circuit board box 40, and the like may be mounted and fixed, can be formed therein.

The air blowing unit 12 includes a casing 20 and an air blower 30. The air blower 30 further includes a motor 31 and fan blades 32. The air blowing unit 12 has an air inlet 33 and an air outlet (not shown), and the motor 31 is energized to rotate the fan blades 32 to generate a wind flow from the air inlet 33 to the air outlet of the casing 20. The air inlet 33 of the air blowing unit 12 is provided in correspondence with the suction opening 13 of the main housing 10, and the air outlet is provided in correspondence with the exhaust opening of the main housing 10. The fan blades 32 are, for example, multi-wing blades.

The circuit board box 40 includes a box body 41 and a cover 42 constituting the circuit board box 40. The circuit board box 40 is provided inside the main housing 10 and is adjacent to the outside of the casing 20. The control circuit board 45 is fixed inside the circuit board box 40. The control circuit board 45 is connected to the air blowing unit 12, and controls the operation of the air blowing unit 12 after receiving the electric signal.

A power supply box 60 is provided outside of the main housing 10, and electric components (not shown) are provided within the power supply box 60. The electric components are connected to the control circuit board 45 through a first lead wire 71, and supplies electric power for the operation of the control circuit board 45 and the air blowing unit 12.

The circuit board box, particularly the design of the waterproof portion provided on the outside thereof, will be described in detail below.

Figure 3:
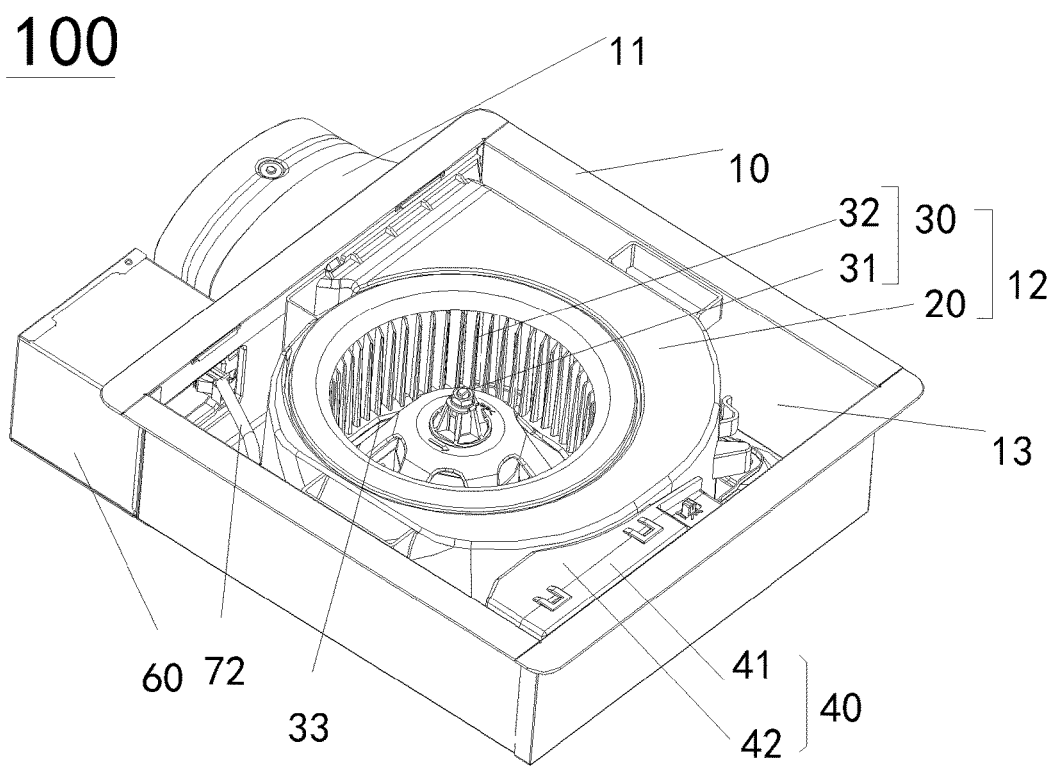
FIG. 3 is a structural schematic view of a ventilating fan according to a first embodiment of the present disclosure.
Figure 4:
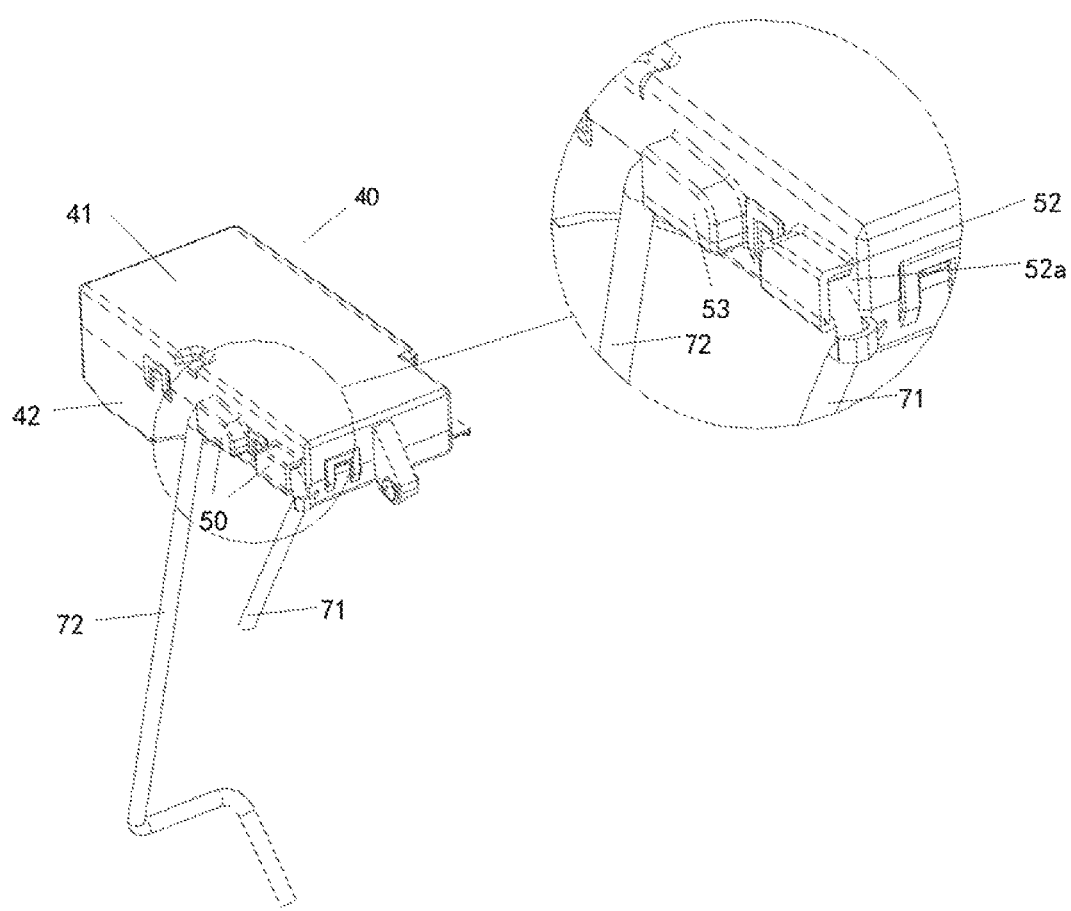
FIG. 4 is an enlarged schematic view of a waterproof portion of the ventilating fan shown in FIG. 3.

Referring to FIGS. 3 and 4, two wiring ports—the first wiring port 43a and the second wiring port 43b, are provided on the wall surface of the circuit board box 40. The first wiring port 43a is the wiring port for the second lead wire 72, through which the electric components in the power supply box 60 supply electric power to the control circuit board 45. The second wiring port 43b is the wiring port for the first lead wire 71, and the control circuit board 45 in the circuit board box 40 transmits the control signal and power to the air blowing unit 12 through the first lead wire 71.

On the wall surface of the circuit board box 40 where the first wiring port 43a and the second wiring port 43b are located, a first waterproof portion 55a is provided in a position corresponding to the first wiring port 43a, and a second waterproof portion 55b is provided in a position corresponding to the second wiring port 43b. The structures of the first waterproof portion 55a and the second waterproof portion 55b are similar to each other, and the second waterproof portion 55b will be described below as an example so as to illustrate both waterproof portions.

As viewed from outside, the waterproof portion 50 is a rectangular parallelepiped body protruding outwards from the circuit board box 40. As viewed from the internal structure, the waterproof portion 50 has a hollow tubular structure in which a guide passage 56 is formed. A first surface thereof is provided with a wiring opening corresponding to the wiring port, and a second surface thereof adjacent to the first surface is provided with an insertion opening for inserting the lead wire into the circuit board box. As in the present embodiment, the waterproof portion 50 has a first wall surface 51 and a second wall surface 52 adjacent to each other and not in the same plane. The first wall surface 51 is provided with a wiring opening 51a, and the second wall surface 52 is provided with an insertion opening 52a. The position of the wiring opening 51a corresponds to the position of the second wiring port 43b on the circuit board box 40. Between the insertion opening 52a and the wiring opening 51a, the waterproof portion 50 is formed with a guide passage 56 therein.

In the present embodiment, the first lead wire 71 enters the guide passage 56 from the insertion opening 52a in the second wall surface 52, and is bent so as to reach the wiring opening 51a provided in the first wall surface 51, and then passes through the second wiring port 43b corresponding to the wiring opening 51a so as to enter the circuit board box 40.

When water vapor enters the ventilating fan, despite the water vapor adheres to the first lead wire 71 and water droplets are formed, the water droplets cannot flow straight along the first lead wire 71 into the circuit board box 40, but are stopped at the bending portion of the first lead wire 71, thereby preventing water droplets from flowing into the circuit board box 40 and coming in contact with the control circuit board 45 or other electrical components, and improving the safety and reliability of the control circuit board 45.

With respect to the waterproof portion 50 of the electrical function cassette of the present embodiment, it should be noted that, (1) in the present embodiment, the waterproof portion 50 is formed integrally with the circuit board box 40, and is not a separate portion. Therefore, the waterproof portion 50 and the circuit board box 40 share the wall surface, that is, the first wall surface 51 of the waterproof portion 50 coincides with the wall surface of the circuit board box 40.

It will be apparent to those skilled in the art that the waterproof portion 50 may also be a separated part, in which case the waterproof portion 50 may have a separate first wall surface 51. The first wall surface 51 is fixed to the wall surface of the circuit board box 40, and the wiring opening 51a corresponds to the first wiring port 43a in the wall surface of the circuit board box 40.

As for the technical feature that the wiring opening 51a of the waterproof portion 50 corresponds to the second wiring port 43b of the circuit board box 40, it means that the wiring opening and the wiring port share a common opening. The wiring opening and the wiring port may be aligned completely to each other, or the two openings may be slightly shifted from each other as long as the first lead wire 71 can pass therethrough.

(2) In the present embodiment, for the sake of illustration, as an example, the first surface acts as the first wall surface (the wall surface where the wiring opening is located), and the second surface adjacent to the first surface acts as the second wall surface (the wall surface where the insertion opening is located).

In the second embodiment, as an example, the third surface opposite to the first surface acts as a third wall surface.

In the fourth embodiment, as an example, the wall surface adjacent to the first wall surface and the second wall surface and treated as the second surface acts as a fourth wall surface.

In the present embodiment, the angle formed between the first and second surfaces is about 90 degrees. In other embodiments of the present disclosure, the angles formed between the first and second surfaces may be in the range of between 30 degrees and 150 degrees, in which it is proved that the present disclosure can be realized.

(3) In the present embodiment, the circuit board box 40 is composed of the box body 41 and the cover 42. The box body 41 is located at a lower position and the cover 42 is located at an upper position. For the waterproof portion, it is also formed by two separated parts—the upper part and the lower part, being snap-fitted together. The upper part is integrally formed with the cover 42, and the lower part is integrally formed with the box body 41.

It should be understood by those skilled in the art that the position of the wiring opening 51a of the waterproof portion 50 needs to correspond to the position of the second wiring port 43b of the circuit board box 40. Under this premise, one part of the waterproof portion 50 may be provided outside of the cover 42 of the circuit board box 40, and the other part of the waterproof portion 50 may be provided outside of the box body 41 of the circuit board box 40. Alternatively, the waterproof portion 50 may be entirely provided outside of the cover 42 of the circuit board box 40, or the waterproof portion 50 may be entirely provided outside of the body box 41 of the circuit board box 40 without affecting the implementation of the present disclosure.

(4) In the present disclosure, the main housing 10 and the waterproof portion 50 are both in a rectangular parallelepiped shape. The rectangular parallelepiped shape here is not necessarily a tightly theoretical rectangular parallelepiped in which each side intersects with each other by 90 degrees, and a slight inclination of the wall surface is also possible. In addition, the rectangular parallelepiped shape of the present disclosure also includes the case where a corner portion is arranged to be a rounded corner, and the case where a rib or a concavity and a convexity is provided on the designated surface.

Figure 5:
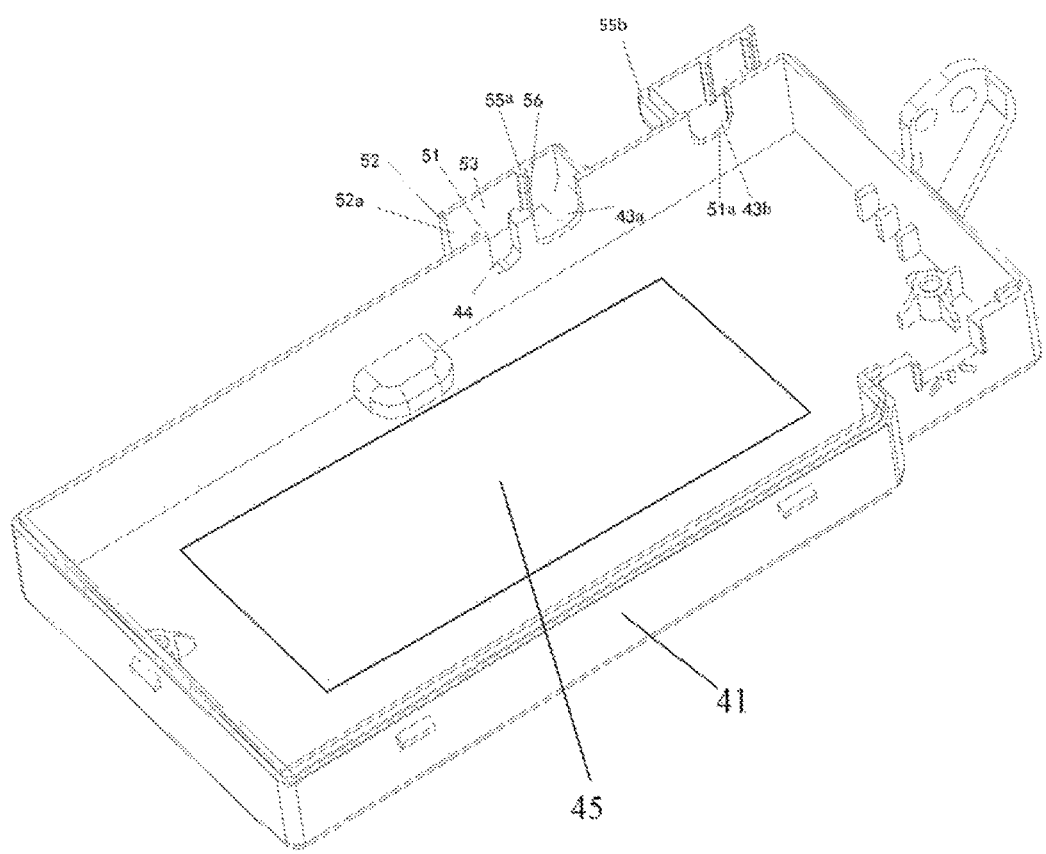
FIG. 5 is a schematic view of a box body and two waterproof portions of a circuit board box of the ventilating fan shown in FIG. 3.

Referring to FIG. 5, in the waterproof portion 50 with a rectangular parallelepiped shape, there are four surfaces defined by the longest sides, and in the present embodiment, the four surfaces are the surfaces adjacent to the second wall surface 52. The surface defined by the two longest sides may be parallel to the wall surface of the circuit board box which is provided with the second wiring port 43b, or may be perpendicular to the wall surface of the circuit board box which is provided with the wiring port. When in above-mentioned parallel relation, the longer the length of the surface defined by the two longest sides is set to be, the longer the waterproof portion 50 becomes in the longitudinal direction, that is, as the length of the surface defined by the two longest sides becomes longer, the insertion opening 52a may be disposed farther from the wiring opening 51a. When the insertion opening 52a is provided at a position farthest from the wiring opening 51a on the second wall surface 52 of the waterproof portion 50, it is possible to make the water droplets more difficult to enter from the second wiring port 43b.

In addition, in order to prevent the first lead wire 71 from being pulled outwardly or being pushed inwardly such that the first lead wire 71 is disengaged from the control circuit board 45, a conventional solution is to provide a snap (not shown) in the inner and outer sides of the circuit board box 40, respectively, so as to solve the above problems. However, the cost would be increased and the time to install the snap would be increased at the same time.

Referring to FIG. 5, in the present embodiment, the circuit board box 40 is provided with an engagement port 44 for engaging a snap of a bundled for first lead wire 71. The snap of the first lead wire 71 is caught by the engagement port 44. In this way, the lead wire cannot be pulled outwardly or pushed inwardly. With the above structure, it is not necessary to provide the snap on the outside side of the circuit board box 40, thereby reducing the cost.

The ventilating fan 100 of the present embodiment may be mounted on a ceiling or may be mounted on a wall. When mounted on the ceiling, the circuit board box 40 is placed vertically. When mounted on the wall, the circuit board box 40 is placed transversely, and the two directions are inconsistent. The waterproof portion 50 of the present disclosure has a rectangular parallelepiped shape, so that the waterproof problem of the circuit board box 40 in both states can be solved by providing different or the same waterproof means on the six wall surfaces of the waterproof portion 50, respectively. Such content will be illustrated in the third and fourth embodiments.

The Second Embodiment

In a second exemplary embodiment of the present disclosure, there is provided a circuit board box having waterproof function which is similar to the circuit board box in the ventilating fan 100 of the first embodiment except that the insertion opening is provided on a different wall surface. The present embodiment is also described, in which the second waterproof portion 55b is taken as an example.

Figure 6:
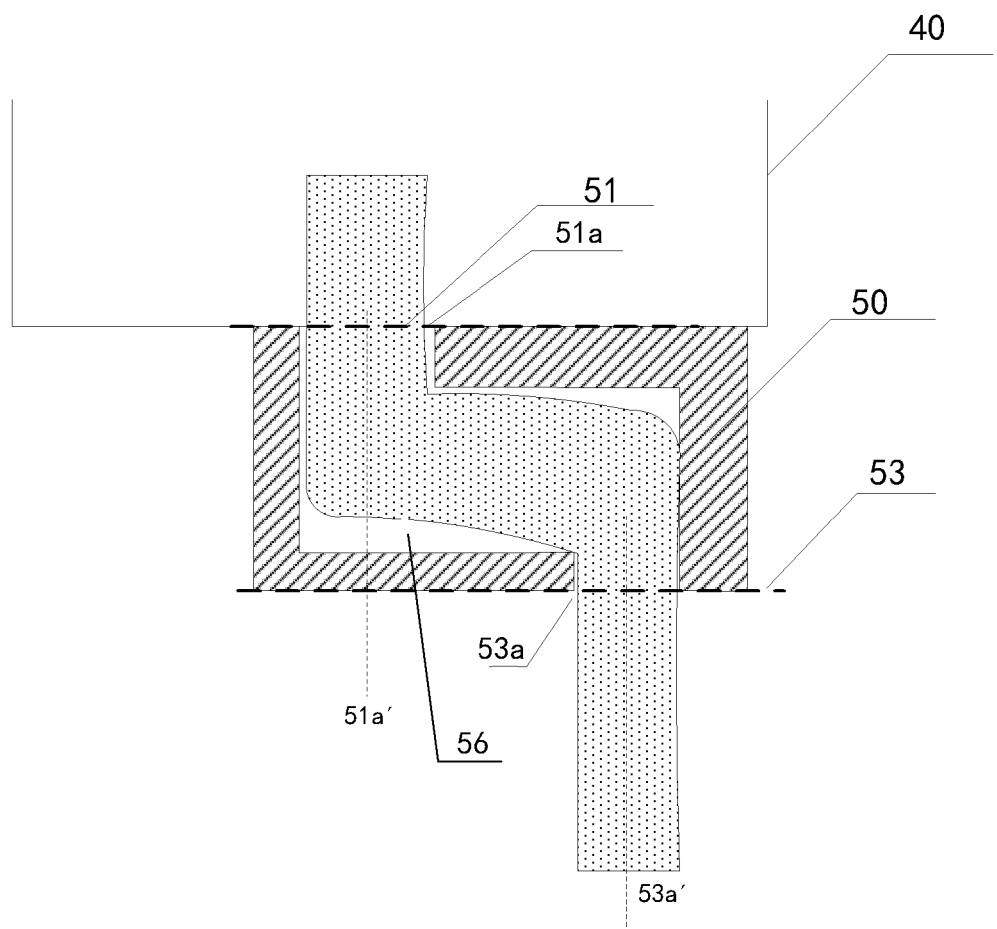
FIG. 6 is a cross-sectional view of a waterproof portion of a circuit board box having a waterproof function according to a second embodiment of the present disclosure.

The first surface is provided with a wiring opening corresponding to the wiring port, and the third face opposite to the first surface is provided with an insertion opening for inserting the lead wire into the circuit board box, as shown in FIGS. 4 and 6. In the present embodiment, the first wall surface 51 of the waterproof portion 50 is provided with a wiring opening 51a, and the third wall surface 53 opposed to the first wall surface 51 is provided with an insertion opening 53a for inserting the first lead wire 71 into the circuit board box 40. The central axis 51a' of the wiring opening 51a and the central axis 53a' of the insertion opening 53a are offset from each other.

For the waterproof portion 50 of the ventilating fan 100 of the present embodiment, when the first lead wire 71 enters the guide passage 56 from the insertion opening 53a, although the first wall surface 51 is opposite to the third wall surface 53, since the central axis 51a' of the wiring opening 51a and the central axis 53a' of the insertion opening 53a are offset from each other, that is, the insertion opening 53a is not directly opposite to the wiring opening 51a, the first lead wire 71 have to be bent so as to reach the wiring opening 51a and then pass through the second wiring port 43b corresponding to the wiring opening 51a to enter the circuit board box 40. Therefore, when water vapor enters the ventilating fan, although the water vapor adheres to the first lead wire 71 to condense into water droplets, the water droplets cannot flow directly into the circuit board box along the first lead wire 71.

Referring to FIG. 6, in the waterproof portion 50 of the rectangular parallelepiped shape, there are four surfaces defined by the longest sides, and in the present embodiment, the four surfaces are the surfaces adjacent to the second wall surface 52 and including the first wall surface 51 and the third wall surface 53. The wall surface defined by two longest sides of the waterproof portion 50 is parallel to the wall surface of the circuit board box 40 provided with the second connection port 43b. The insertion opening 53a is provided at a position farthest from the wiring opening 51a on the third wall surface 53.

In the present embodiment, when the surface defined by the two longest sides may be parallel to the wall surface of the circuit board box which is provided with the second wiring port 43b, the longer the length of the surface defined by the two longest sides is set to be, the longer the waterproof portion 50 becomes in the longitudinal direction, that is, when the length of the surface defined by the two longest sides becomes longer, the insertion opening 53a can be disposed farther from the wiring opening 51a. When the insertion opening 53a is provided at a position farthest from the wiring opening 51a on the third wall surface 53 of the waterproof portion 50, it is possible to make the water droplets more difficult to enter from the second wiring port 43b.

Therefore, it is possible to further prevent the contact of the water droplets with the control circuit board and the electric component in the circuit board box, thereby further improving the product safety.

The Third Embodiment

Figure 7:
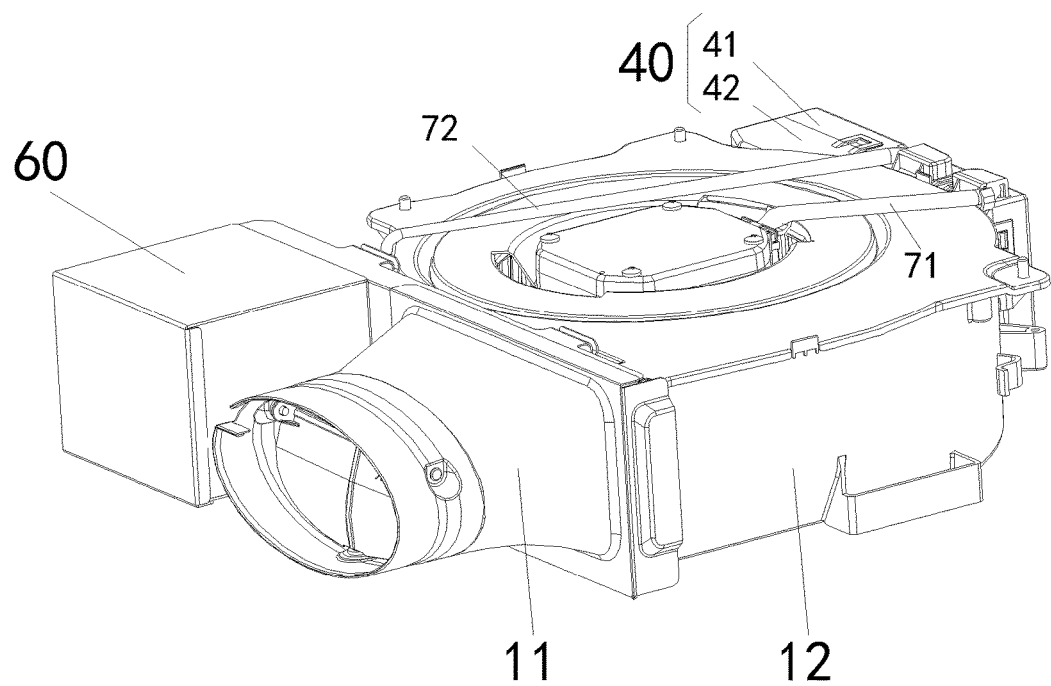
FIG. 7 is a perspective view of a ventilating fan mounted on a ceiling according to a third embodiment of the present disclosure.

In the third exemplary embodiment of the present disclosure, there is provided a ventilating fan which is mounted on the ceiling and the circuit board box is vertically placed as shown in FIG. 7, that is, a wall with a larger area in a circuit board box is perpendicular to the horizontal plane. The ventilating fan is similar to the ventilating fan of the first embodiment except that the inner wall of the waterproof portion is provided with a rib. Similarly, the present embodiment is also described as an example in which the second waterproof portion 55b is taken as an example.

Figure 8:
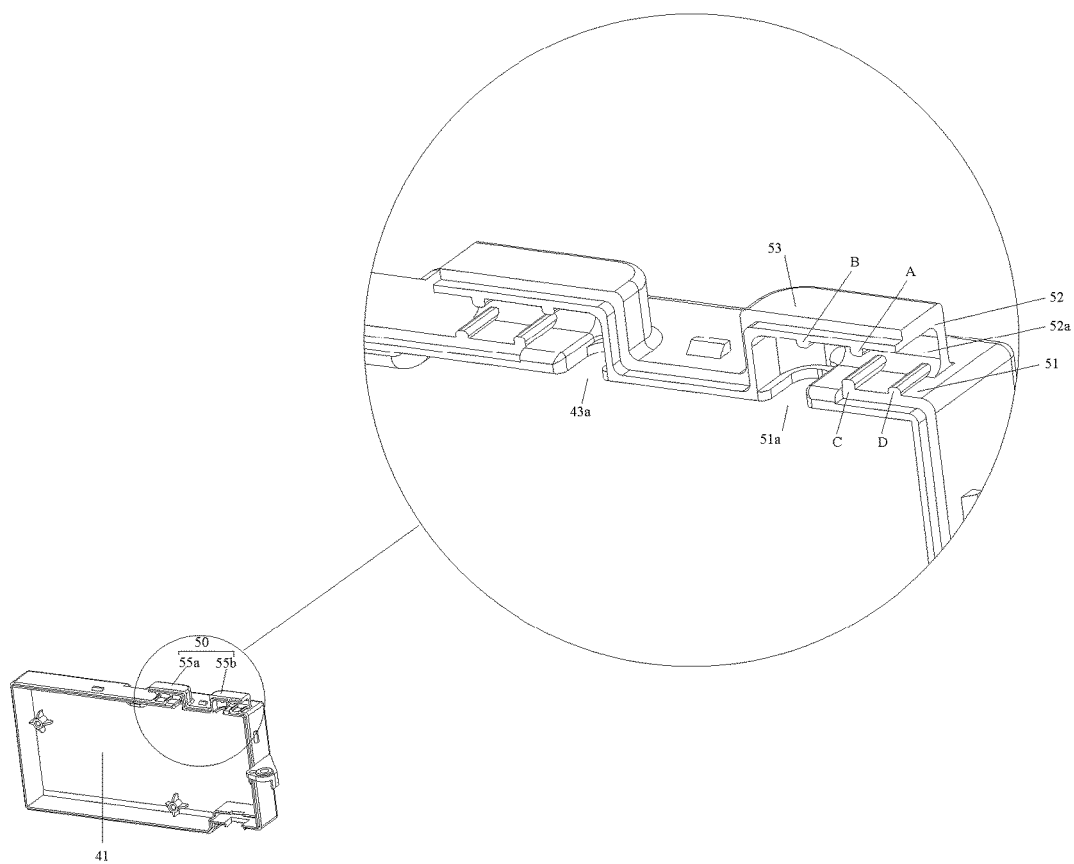
FIG. 8 is a perspective view and a partially enlarged view of the circuit board box of the ventilating fan shown in FIG. 7.

Referring to FIG. 8, the inner wall of the guide passage 56 is provided with a rib which can be brought into contact with the first lead wire (not shown in FIG. 8). When the first lead wire is in contact with the rib and the water droplets flow along the first lead wire into the circuit board box 40, even if a small portion of the water droplets enter the guide passage 56, it would be blocked by the rib on the guide passage 56 and cannot enter the circuit board box 40, thereby achieving multiple waterproof of the circuit board box 40.

Figure 9:
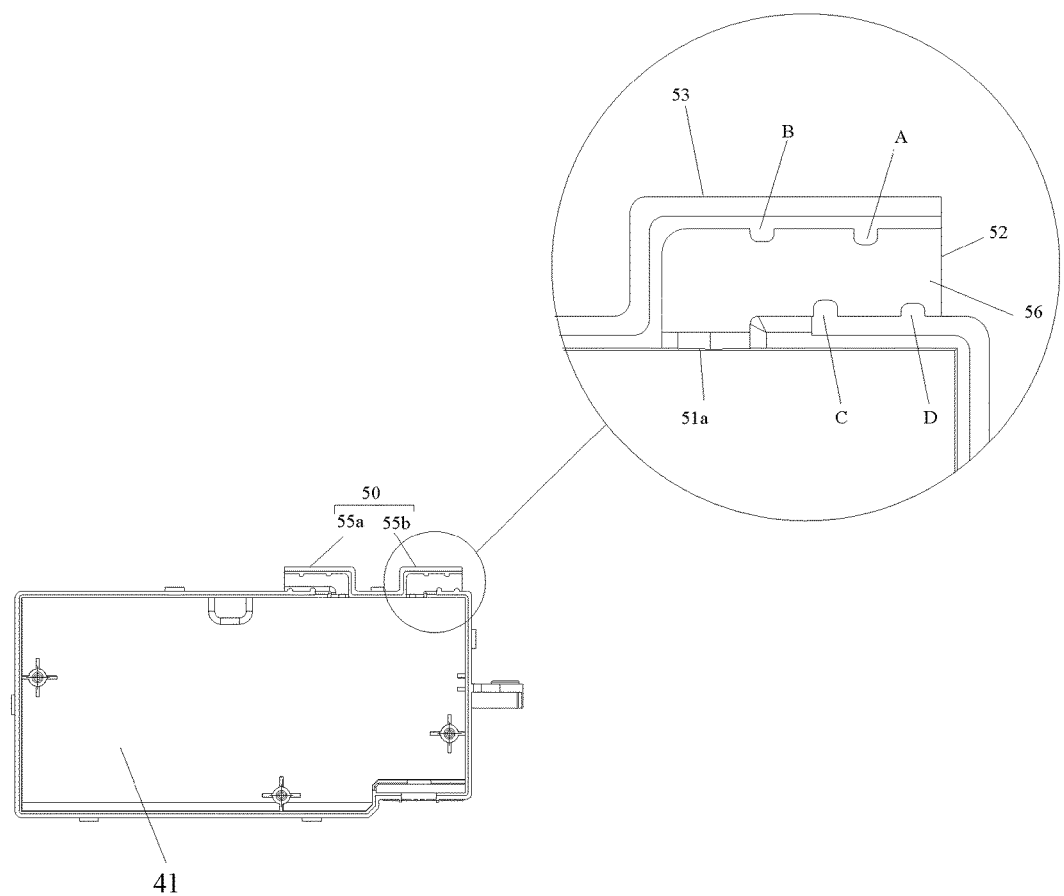
FIG. 9 is a partial cross-sectional view of the waterproof portion of the circuit board box shown in FIG. 8.

Further, referring to FIG. 9, the insertion opening 52a is provided in the second wall surface 52, the third wall surface 53 is the top surface, and the first wall surface 51 is the bottom surface. The wiring opening 51a is opened upwardly. The inner wall of the waterproof portion 50, that is, the first wall surface 51 on which the wiring opening 51a is located, is provided with the ribs (C, D) projecting from the first wall surface 51 toward the first lead wire (not shown in FIG. 9). The third wall surface 53 opposite to the wiring opening 51a is provided with two ribs (A, B) projecting from the third wall surface 53 toward the first lead wire.

Among the ribs (C, D) provided on the first wall surface 51, the rib D provided near the insertion opening 52a has a smaller protrusion height than the rib C near the wiring opening 43b, i.e., the protruding length of the rib C is larger than the protruding length of the rib D. Among the ribs (A, B) on the third wall surface 53, the rib A near the insertion opening 52a has a larger degree of protrusion than the rib B near the wiring opening 51a, that is, the protruding length of the rib A is larger than the protruding length of the rib B.

In this way, the ribs B and C near the wiring opening 51a form a space for bringing the first lead wire closer to the third wall surface 53, and the ribs A and D near the insertion opening 52a form a space for bringing the first lead wire closer to the first wall 51, so that the first lead wire in the waterproof portion 50 is inclined downwardly from the wiring opening 51a side toward the insertion opening 52a side in the guide passage 56.

When the first lead wire is inclined downwardly from the wiring opening 51a side toward the insertion opening 52a side in the guide passage 56, even if the wiring opening 51a is opened upwardly, it's difficult for the water droplets to enter the circuit board box due to the inclination of the first lead wire, thereby further preventing the water droplets from contacting with the control circuit board and the electric components, thereby further improving the product safety.

It will be understood by those skilled in the art that since the ventilating fan of the present embodiment is mounted on the ceiling, the ribs of specific heights are provided on the first wall surface 51 and the third wall surface 53. If the placing direction of the circuit board box is changed or the ventilating fan is mounted on the floor or the wall, the bottom surface of the waterproof portion 50 (the wall surface which is substantially parallel to the ground and is closer to the ground) and/or the top surface (the wall surface which is substantially parallel to the ground and is opposite to the bottom surface) should be provided with corresponding ribs so that the first lead wire is inclined downwardly in the direction toward the insertion opening 52a, making it difficult for the water droplets to enter the circuit board box.

The Fourth Embodiment

Figure 10:
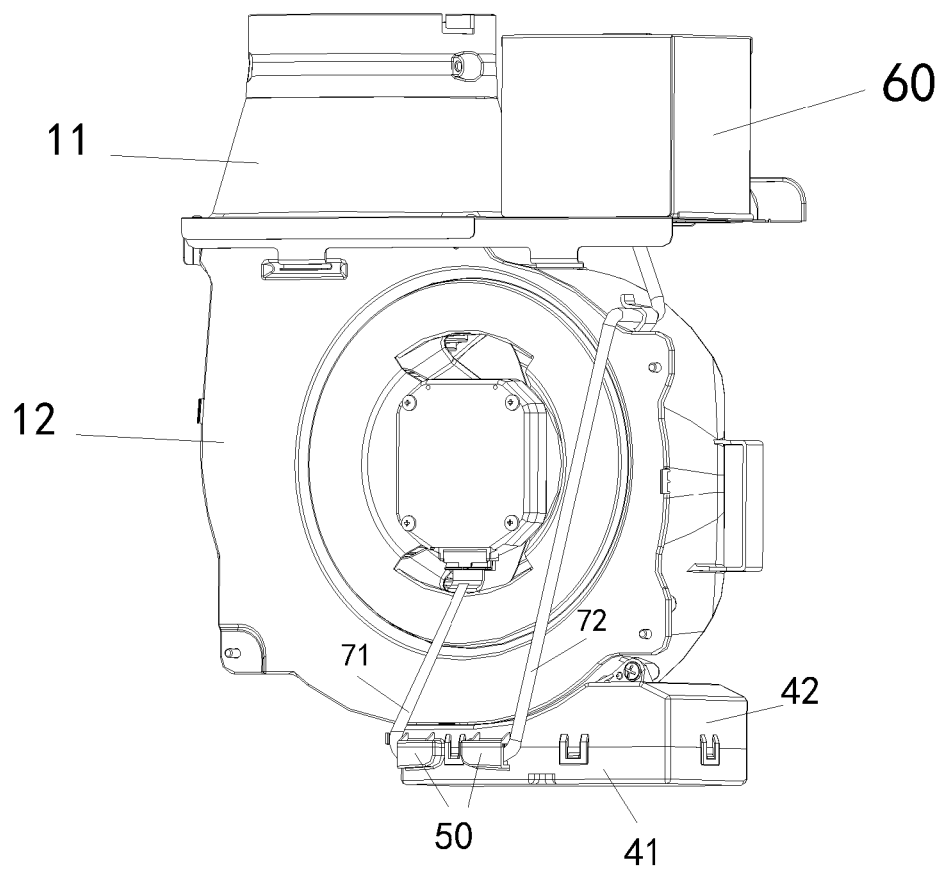
FIG. 10 is a perspective view of a ventilating fan vertically mounted on a wall according to a fourth embodiment of the present disclosure.

In a fourth exemplary embodiment of the present disclosure, there is provided a ventilating fan mounted on a wall, with the circuit board box being placed horizontally as a whole. As shown in FIG. 10, the wall surface with a larger area of the circuit board box is parallel to the horizontal plane. The ventilating fan is similar to the ventilating fan of the first embodiment except that the wall surface constituting the waterproof portion is designed as an inclined wall surface to improve the waterproof effect. Similarly, the present embodiment is also described as an example in which the second waterproof portion 55b is taken as an example.

Figure 11:
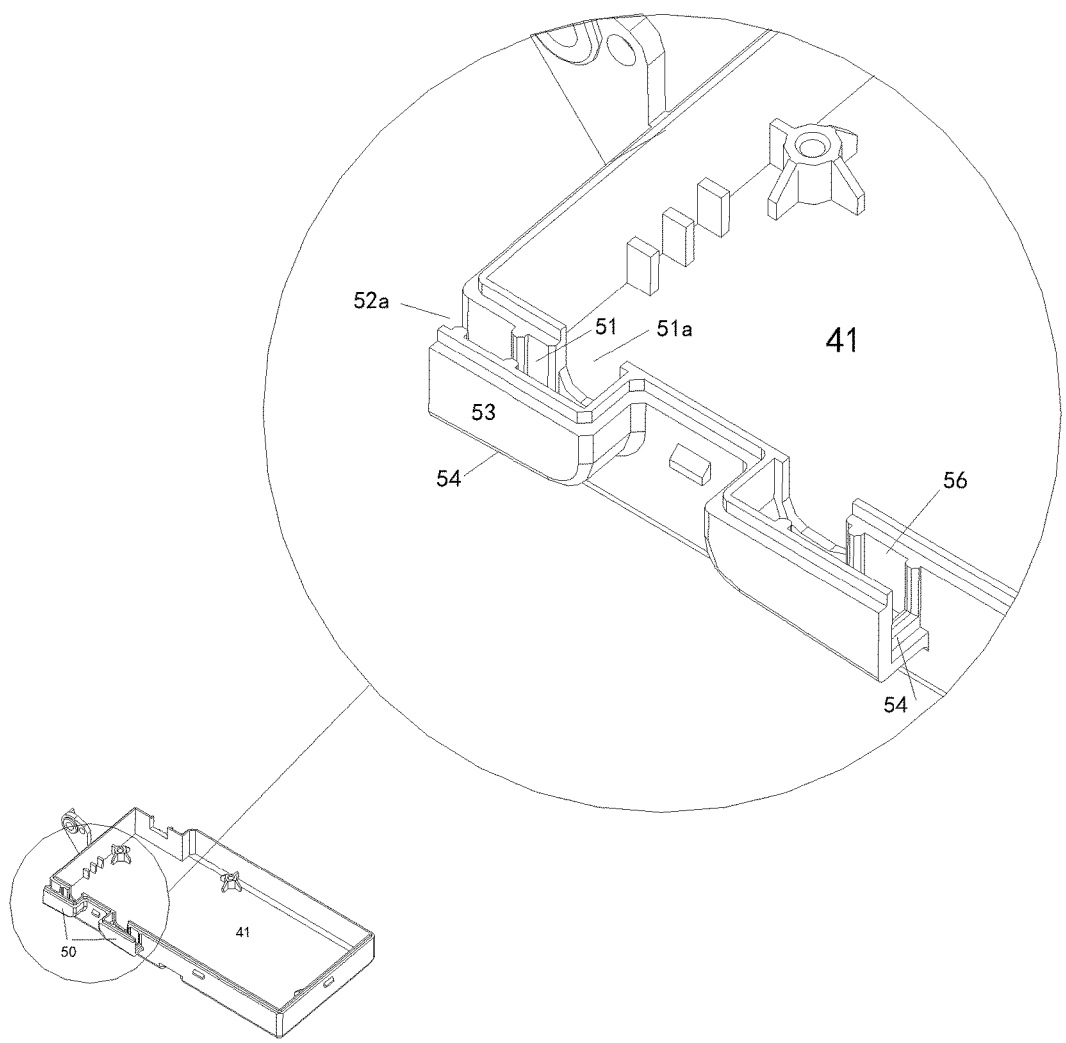
FIG. 11 is a perspective view and a partial enlarged view of the circuit board box of the ventilating fan shown in FIG. 10.

Referring to FIG. 11, on the waterproof portion 50 in a rectangular parallelepiped shape, the wall surface adjacent to both the first wall surface 51 and the second wall surface 52 is defined as the fourth wall surface 54 of the waterproof portion 50. The insertion opening is provided in the second wall surface 52 and the fourth wall surface 54 acts as the bottom surface. The fourth wall surface 54 adjacent to the second wall surface 52 provided with the insertion opening 52a is inclined downwardly in the direction from the wiring opening 51a to the insertion opening 52a.

In the present embodiment, when the water droplets enter the waterproof portion 50 along the first lead wire (not shown in FIG. 11), since the fourth wall surface 54 is inclined such that the area of the vertical cross section of the guide passage 56 becomes larger from the wiring opening 51a to the insertion opening 52a, that is, is inclined in the direction towards the insertion opening 52a, the water droplet drips at the position where the first lead wire comes into contact with the fourth wall surface 54 and flows out of the insertion opening 52a in the oblique direction of the fourth wall surface 54, thereby further preventing water droplets from contacting the control circuit board and the electrical components so as to further improve product safety.

It will be understood by those skilled in the art that since the ventilating fan of the present embodiment is mounted on the wall, the fourth wall surface 54 is disposed so as to be inclined downward. If the placing direction of the circuit board box is changed or the ventilating fan is mounted on the floor or the ceiling, the corresponding bottom surface (the wall surface substantially parallel to the floor) of the waterproof portion should be set to be inclined downward so as to facilitate the outflow of the water droplets.

In addition, the direction in which the area of the vertical cross section of the guide passage becomes larger means that when the wall surface of the waterproof portion is inclined, the area of the vertical cross section of the guide passage becomes larger as the wall surface is inclined.

Further, when the insertion opening 52a is provided on the third wall surface 53 facing the first wall surface 51, the surface (e.g., the second wall surface 52) adjacent to the third wall surface 53 is inclined such that the area of the vertical cross section of the guide passage 56 becomes larger from the wiring opening 51a to the insertion opening 52a, and similarly cause the water droplets to flow out of the insertion opening 52a in the oblique direction.

Heretofore, four embodiments of the present disclosure have been described in detail with reference to the drawings. According to the above description, those skilled in the art will have a clear understanding of the present disclosure. For the present disclosure, it should be noted that:

(1) Although the first, third and fourth embodiments are described in which the ventilating fan is taken as an example, the above-described embodiments also disclose corresponding circuit board box, and those skilled in the art, based on the above description, should have a clear understanding about the structure of the circuit board box and the working principle thereof;

(2) Although the circuit board boxes are disclosed in the first, second, third and fourth embodiments, the same applies to other electrical function cassette, for example, the power supply box connected to the air blower in FIG. 3. The protection scope of the present disclosure should not be limited to the circuit board box in the above embodiment, but to all electrical function cassettes having a waterproof demand;

(3) the present disclosure circuit board box can be used in other appliances rather than ventilating fans, such as the air conditioner, the refrigerators, etc., and therefore, the protection scope of the present disclosure should not be limited to the ventilating fans in the above embodiments, but to all electrical appliances with electrical waterproof demand.

Moreover, in the drawings or in the text of the specification, implementations that are not shown or described are in the form known to those of ordinary skill in the art and are not described in detail. In addition, the above-described definitions of the elements and methods are not limited to the various specific structures, shapes or modes mentioned in the embodiments, and one of ordinary skill in the art may simply change or replace them.

It is to be noted that the directional terms mentioned in the examples, such as "up", "down", "front", "rear", "left", "right", etc., refer only to the direction of the drawings, and are not used to limit the protection range of the present disclosure. The embodiments described above may be used in combination with each other or may be used in combination with other embodiments based on design and reliability considerations, i.e., the technical features in the different embodiments may be freely combined to form more embodiments.

Furthermore, the terms used in the specification and claims, such as "first", "second", "third" and the like, are used to define the corresponding elements, and in their own meaning are not intended to be representative of any order of the elements and not intended to be representative of the order between one element and the other element. The ordinal terms are used only to make a component with a certain name distinguishable from another element with the same name.

It should be noted that in the above description, some specific embodiments are for illustrative purposes only and should not be construed as limiting the present disclosure, but merely an example of an embodiment of the present disclosure. The conventional structure or construction will be omitted when it may cause confusion with the understanding of the present disclosure. It should be noted that the shapes and dimensions of the components in the figures do not reflect the true size and scale, but only the schematic contents of the embodiments of the present disclosure.

In view of the above, the present disclosure provides an electrical function cassette having waterproof function and a ventilating fan employing the same. The electrical function cassette comprises a function box for housing an electrical component, and further comprises a waterproof portion in hollow rectangular parallelepiped shape, wherein a first surface of the waterproof portion is provided with a wiring opening corresponding to a wiring port, and a second surface of the waterproof portion adjacent to the first surface is provided with an insertion opening for inserting a lead wire into the electrical function cassette, such that the water droplet cannot flow straight along the lead wire into the electrical function cassette, thereby improving the waterproof performance of the electrical function cassette. Further, by designing the inclined surface of the guide passage, the ribs on inner surface of the wall, the waterproof performance of the electrical function cassette is further improved, thereby improving the safety and reliability of the entire product. The electrical function cassette can be used in ventilating fans, the air conditioner, the refrigerators and other electrical appliances or other occasions, with high practical value.

In the specific embodiments described above, the purpose, technical scheme and advantageous effects of the present disclosure are described in further detail. It is to be understood that the above description is only a specific embodiment of the present disclosure and is not intended to limit the present disclosure, and any modification, equivalence replacement, improvement and the like within the spirit and principles of the present disclosure should be included in the scope of the present invention.

What is claimed is:

1. An electrical function cassette having a waterproof function, comprising:
    a function box for housing an electrical component,
    a waterproof portion in a hollow rectangular parallelepiped shape, and
    a first surface of the waterproof portion is provided with a wiring opening corresponding to a wiring port provided on a wall surface of the electrical function cassette, and a second surface of the waterproof portion adjacent to the first surface and not parallel to the first surface is provided with an insertion opening for inserting a lead wire into the waterproof portion,
    wherein the lead wire is adapted to run through the insertion opening, and bent towards the electrical function cassette and run through the wiring opening and the wiring port so as to be inserted into the electrical function cassette;
    wherein the waterproof portion is integrally formed with the electrical function cassette or separately formed with the electrical function cassette and fixed thereto, and is configured to protrude outwards from the wall surface of the electrical function cassette provided with the wiring port at a position corresponding to the wiring port such that the wiring opening is aligned with the wiring port.

2. The electrical function cassette having waterproof function according to claim 1, wherein,
    a surface defined by the longest sides of the waterproof portion is provided to be parallel to the wall surface of the electrical function cassette provided with the wiring port, and the insertion opening is provided on the second surface at a position farthest from the wiring opening.

3. The electrical function cassette having waterproof function according to claim 1, wherein, a space connecting the insertion opening with the wiring opening forms a guide passage.

4. The electrical function cassette having waterproof function according to claim 3, wherein,
    the guide passage is provided with a rib capable of coming into contact with the lead wire therein.

5. The electrical function cassette having waterproof function according to claim 4, wherein,
    an inner wall of the waterproof portion, which is a wall surface opposite to the wiring opening, is provided with a plurality of ribs protruding towards the lead wire from the wall surface; and
    the rib provided near the insertion opening in the guide passage has a larger protrusion height than the rib provided near the wiring opening in the guide passage.

6. The electrical function cassette having waterproof function according to claim 4, wherein,
    an inner wall of the waterproof portion, which is a wall surface on which the wiring opening is located, is provided with a plurality of ribs protruding towards the lead wire from the wall surface; and
    the rib provided near the insertion opening in the guide passage has a smaller protrusion than height the rib provided near the wiring opening in the guide passage.

7. The electrical function cassette having waterproof function according to claim 3, wherein,
    a surface, adjacent to a wall surface in which the insertion opening is provided, is inclined in a direction such that the area of the vertical cross section of the guide passage becomes larger from the wiring opening to the insertion opening.

8. The electrical function cassette having waterproof function according to claim 1, wherein,
    the electrical function cassette is provided with an engagement port for engaging a snap of a bundled lead wire.

9. The electrical function cassette having waterproof function according to claim 1, wherein,
    the function box comprises: a box body and cover,
    wherein, a first part of the waterproof portion is provided on the box body, a second part of the waterproof portion is provided on the cover, and the first part and the second part are snap-fitted together so as to form the waterproof portion; and
    the first part is formed integrally with the box body, and the second part is formed integrally with the cover.

10. The electrical function cassette having waterproof function according to claim 1, wherein,
    the electrical function cassette is a circuit board box or a power supply box.

11. A Ventilating Fan, comprising:
    a main housing;

an air blowing unit provided in the main housing and for sucking air into the main housing and blowing air out of the main housing;

a control circuit board connected to the air blowing unit so as to control the operation of the air blowing unit; and a circuit board box, the circuit board box being the electrical function cassette according to claim 1, with the control circuit board being fixed in the circuit board box.

12. An electrical function cassette having waterproof function, comprising:

a function box for housing an electrical component, a waterproof portion in a hollow rectangular parallelepiped shape, and a first surface of the waterproof portion is provided with a wiring opening corresponding to a wiring port provided on a wall surface of the electrical function cassette, and a third surface of the waterproof portion opposite to the first surface is provided with an insertion opening for inserting a lead wire into the waterproof portion, and the lead wire is adapted to run through the insertion opening, and then bent towards the electrical function cassette and run through the wiring opening and the wiring port so as to be inserted into the electrical function cassette;

wherein a central axis of the wiring opening is offset from a central axis of the insertion opening;

wherein the waterproof portion is integrally formed with the electrical function cassette or separately formed with the electrical function cassette and fixed thereto, and is configured to protrude outwards from the wall surface of the electrical function cassette provided with the wiring port at a position corresponding to the wiring port such that the wiring opening is aligned with the wiring port.

13. The electrical function cassette having waterproof function according to claim 12, wherein, a surface defined by the longest sides of the waterproof portion is provided to be parallel to the wall surface of the electrical function cassette provided with the wiring port, the insertion opening is provided on the third surface at a position farthest from the wiring opening.

14. The electrical function cassette having waterproof function according to claim 12, wherein, a space connecting the insertion opening with the wiring opening forms a guide passage.

15. The electrical function cassette having waterproof function according to claim 14, wherein, the guide passage is provided with a rib capable of coming into contact with the lead wire therein.

16. The electrical function cassette having waterproof function according to claim 15, wherein, an inner wall of the waterproof portion, i.e. a wall surface opposite to the wiring opening, is provided with a plurality of ribs protruding towards the lead wire from the wall surface; and the rib provided near the insertion opening in the guide passage has a larger protrusion height than the rib provided near the wiring opening in the guide passage.

17. The electrical function cassette having waterproof function according to claim 15, wherein, an inner wall of the waterproof portion, which is a wall surface on which the wiring opening is located, is provided with a plurality of ribs protruding towards the lead wire from the wall surface; and the rib provided near the insertion opening in the guide passage has a smaller protrusion height than the rib provided near the wiring opening in the guide passage.

18. The electrical function cassette having waterproof function according to claim 14, wherein, a surface, adjacent to a wall surface in which the insertion opening is provided, is inclined in a direction such that the area of the vertical cross section of the guide passage becomes larger from the wiring opening to the insertion opening.

19. The electrical function cassette having waterproof function according to claim 12, wherein, the electrical function cassette is provided with an engagement port for engaging a snap of a bundled lead wire.

20. The electrical function cassette having waterproof function according to claim 12, wherein, the function box comprises: a box body and cover, wherein, a first part of the waterproof portion is provided on the box body, a second part of the waterproof portion is provided on the cover, and the first part and the second part are snap-fitted together so as to form the waterproof portion; and the first part is formed integrally with the box body, and the second part is formed integrally with the cover.

21. The electrical function cassette having waterproof function according to claim 12, wherein, the electrical function cassette is a circuit board box or a power supply box.

22. A Ventilating Fan, comprising a main housing;

an air blowing unit provided in the main housing and for sucking air into the main housing and blowing air out of the main housing;

a control circuit board connected to the air blowing unit so as to control the operation of the air blowing unit; and a circuit board box, the circuit board box being the electrical function cassette according to claim 12, with the control circuit board being fixed in the circuit board box.

* * * * *

UNITED STATES PATENT AND TRADEMARK OFFICE
CERTIFICATE OF CORRECTION

PATENT NO. : 10,299,394 B2
APPLICATION NO. : 15/685243
DATED : May 21, 2019
INVENTOR(S) : Shenghui Zhong et al.

Page 1 of 1

It is certified that error appears in the above-identified patent and that said Letters Patent is hereby corrected as shown below:

On the Title Page

Item (72) Inventors: insert -- Jian Chen, Guangdong CN --

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*